(12) United States Patent
Choi

(10) Patent No.: US 7,792,090 B2
(45) Date of Patent: Sep. 7, 2010

(54) DETERMINING AN INTER-SLOT POWER LEVEL

(75) Inventor: Ji Hyun Choi, Seoul (KR)

(73) Assignee: LG Electronics Inc., Seoul (KR)

( * ) Notice: Subject to any disclaimer, the term of this patent is extended or adjusted under 35 U.S.C. 154(b) by 931 days.

(21) Appl. No.: 11/613,161

(22) Filed: Dec. 19, 2006

(65) Prior Publication Data

US 2007/0149239 A1 Jun. 28, 2007

(30) Foreign Application Priority Data

Dec. 22, 2005 (KR) .................... 10-2005-0127751

(51) Int. Cl.
*H04B 7/212* (2006.01)

(52) U.S. Cl. .................. 370/347; 370/335; 370/316; 370/537; 375/295; 375/316; 375/303; 375/308; 455/522; 455/69; 455/509; 455/127.4; 455/130

(58) Field of Classification Search ........... 375/295, 375/316, 303, 308; 455/522, 69, 509, 127.4, 455/130; 370/335, 316, 537
See application file for complete search history.

(56) References Cited

U.S. PATENT DOCUMENTS

| 6,606,308 | B1 | 8/2003 | Genest et al. | |
|---|---|---|---|---|
| 2002/0072334 | A1* | 6/2002 | Dunne et al. | ............ 455/67.1 |
| 2002/0168026 | A1 | 11/2002 | Khoini-Poorfard | |
| 2003/0207681 | A1* | 11/2003 | Rowitch | ............ 455/404.2 |
| 2005/0018780 | A1 | 1/2005 | Kim | |
| 2005/0054308 | A1 | 3/2005 | Vayrynen et al. | |
| 2005/0281353 | A1 | 12/2005 | Huang et al. | |
| 2006/0262879 | A1* | 11/2006 | Smith et al. | ............ 375/297 |

FOREIGN PATENT DOCUMENTS

| EP | 1 094 618 A1 | 4/2001 |
|---|---|---|
| EP | 1 592 129 A1 | 11/2005 |
| KR | 10-2005-0007818 A | 1/2005 |
| WO | 97/23062 | 6/1997 |
| WO | 01/22599 A2 | 3/2001 |

OTHER PUBLICATIONS

Peter Bode et al: "Combined GMSK and 8PSK Modulator for GSM and EDGE" pp. III-614-III-617; XP-002318484, 2003.

* cited by examiner

*Primary Examiner*—Rafael Pérez-Gutiérrez
*Assistant Examiner*—Nimesh Patel
(74) *Attorney, Agent, or Firm*—Workman Nydegger

(57) ABSTRACT

Methods for determining an inter-slot power level are disclosed. In one example embodiment, the inter-slot is positioned between first and second timeslots capable of transmitting modulated signals. A first timeslot power level and a second timeslot power level are first acquired. A power level of the inter-slot is then determined using the first and second timeslot power-levels. In this example embodiment, the inter-slot power level is maintained within a predetermined deviation from a specific range. The specific range is defined by the first and second timeslot power-levels.

17 Claims, 5 Drawing Sheets

DETERMINING AN INTER-SLOT POWER LEVEL

CROSS-REFERENCE TO RELATED APPLICATIONS

The present disclosure claims the benefit of Korean Application No. 10-2005-0127751, filed on Dec. 22, 2005, which is hereby incorporated by reference in its entirety.

BACKGROUND

1. Field of the Invention

The present invention relates to data transmission in a Time Division Multiple Access (TDMA) system. More particularly, embodiments of the invention relate to methods for determining an inter-slot power level during data transmission in a TDMA system.

2. Related Technology

With advances in wireless communication technologies, various wireless communication standards with increasingly optimized data transfer rates have been developed. For example, the European Telecommunications Standards Institute (ETSI) has utilized a gaussian minimum shift keying (GMSK) scheme as a modulation scheme in Global System for Mobile Communication (GSM) systems. The ETSI has also utilized an 8-phase shift keying (8PSK) scheme as a modulation scheme in Enhanced Data rates for Global Evolution (EDGE) systems.

EDGE systems can be configured to transmit data modulated by multiple modulation schemes. For example, a first timeslot of data may be modulated using an "8PSK" modulation scheme and a second timeslot of data may be modulated using a "GMSK" modulation scheme. This example modulation scheme is known as an "8PSK+GMSK" dual modulation scheme. The period of time between the first and second timeslots in this example is known as an "inter-slot." Typically the power level of the data transmission signal during an inter-slot in an EDGE system is determined using predetermined ramping values stored in memory.

This conventional approach of using predetermined ramping values in determining inter-slot power levels has at least three problems. First, the conventional use of predetermined ramping values in determining inter-slot power levels can cause power versus time (PVT) errors. Second, if a power level between timeslots is abruptly changed, a spurious signal can occur, resulting in increased data errors. Third, this conventional method may have a negative influence upon the switching characteristics between the first and second timeslots.

FIGS. 1 and 2 are waveform diagrams disclosing example cases in which data modulated by two different modulation schemes is transmitted. In FIG. 1, the data is transmitted by both modulation schemes at the same power level. In FIG. 2, the data is transmitted by each modulation scheme at a different power level. FIGS. 1 and 2 also disclose a PVT graph that represents data modulated by an 8PSK scheme that is transmitted to a first timeslot and data modulated by a GMSK scheme that is transmitted to a second timeslot.

As disclosed in FIG. 1, where the first timeslot power level is equal to the second timeslot power level, the inter-slot power level may be abruptly lowered during the inter-slot. The abrupt lowering of the power level during the inter-slot may result in a spurious signal. Furthermore, as disclosed in FIG. 2, where the first timeslot power level is significantly different from the second timeslot power level, an inter-slot power level may be abnormally determined due to the use of a predetermined ramping value in the determination of the inter-slot power level.

Hence, it would be desirable to provide the ability to determine an inter-slot power level dynamically using the actual power-levels of the surrounding timeslots in order to avoid spurious signals and abnormal inter-slot power level determinations.

SUMMARY OF EXAMPLE EMBODIMENTS

Accordingly, embodiments of the present invention are directed to methods for determining an inter-slot power level. Embodiments of the present invention avoid the modification of modulation characteristics caused by an abrupt power-level variation between timeslots. Embodiments of the present invention also enable the ability to variably determine an inter-slot power level according to surrounding timeslot power-levels. Embodiments of the present invention thus minimize spurious signals from being generated due to abrupt power-level variations between timeslots.

In one example embodiment of the present invention, a method for determining an inter-slot power level is disclosed. The inter-slot is positioned between first and second timeslots capable of transmitting modulated signals. A first timeslot power level and a second timeslot power level are first acquired. A power level of the inter-slot is then determined using the first and second timeslot power-levels. In this example embodiment, the inter-slot power level is maintained within a predetermined deviation from a specific range. The specific range is defined by the first and second timeslot power-levels.

In another example embodiment of the present invention, another method for determining an inter-slot power level is disclosed. As with the first example, the inter-slot is positioned between first and second timeslots capable of transmitting modulated signals. A power level of the first and second timeslots is first acquired. Next, an inter-slot power level is determined using an interpolation calculated using the first and second timeslot power-levels.

In yet another embodiment of the present invention, another method for determining an inter-slot power level is disclosed. The first and second timeslot power levels are acquired. The first and second timeslots are configured to transmit signals modulated by either a GMSK scheme or an 8PSK scheme. Next, a power level of the inter-slot positioned between the first and second timeslots is determined. The inter-slot power level is determined such that the inter-slot power level is linearly changed in time according to a slope defined by the first timeslot power-level and the second timeslot power-level. Finally, data is transmitted at the determined inter-slot power level.

It is to be understood that both the foregoing general description and the following detailed description of the present invention are example and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the example embodiments of the invention. In the drawings.

DETAILED DESCRIPTION OF EXAMPLE EMBODIMENTS

Reference will now be made in detail to example embodiments of the present invention of which are disclosed in part in the accompanying drawings. Wherever possible, the same reference numbers will be used throughout the drawings to refer to the same or like parts.

A timeslot is a unit of time assigned to a transmitting device in order to transmit a modulated signal in a TDMA system. A GSM system can assign only one timeslot to a single transmitting device. However, a General Packet Radio Service (GPRS) system or an EDGE system can assign a plurality of timeslots to a single transmitting device. Example embodiments of the present invention can be applied to a plurality of systems based on the TDMA scheme. For example, embodiments of the present invention can be applied to a 2.5 generation GPRS or EDGE system, which is also known as a 2.75 generation GPRS or EDGE system.

If data is transmitted to a single transmitting device via a plurality of consecutive timeslots, an inter-slot is positioned between each individual pair of consecutive timeslots. Example embodiments of the present invention provide methods for determining a power level of the above-mentioned inter-slots.

Figure 1:
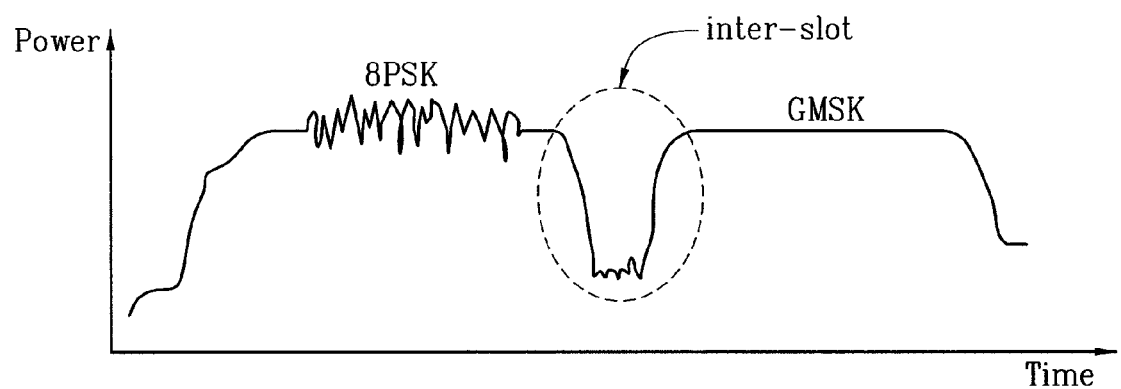
FIG. 1 is a waveform diagram illustrating an example case in which data modulated by different schemes is transmitted at the same power level according to the conventional art.
Figure 2:
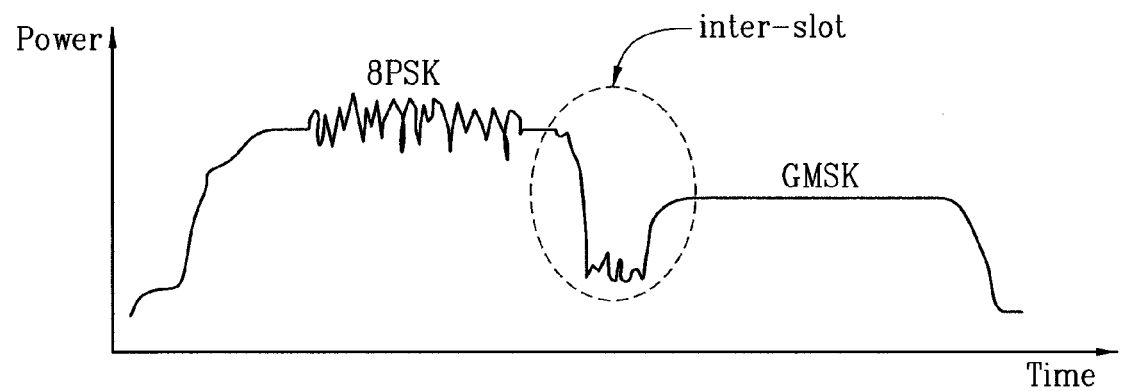
FIG. 2 is a waveform diagram illustrating an example case in which data modulated by different schemes is transmitted at different power levels according to the conventional art.
Figure 3:
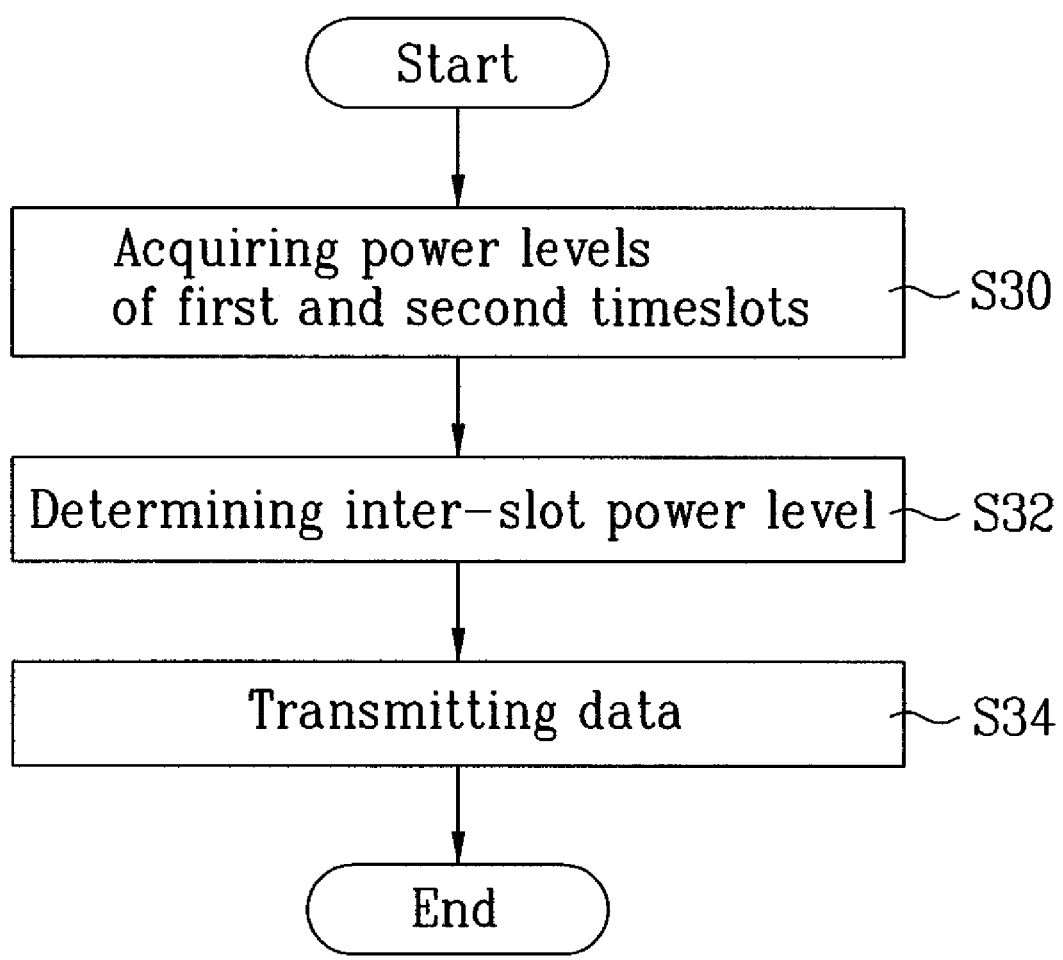
FIG. 3 is a flow chart illustrating a method for determining an inter-slot power level in accordance with an example embodiment of the present invention.
Figure 4:
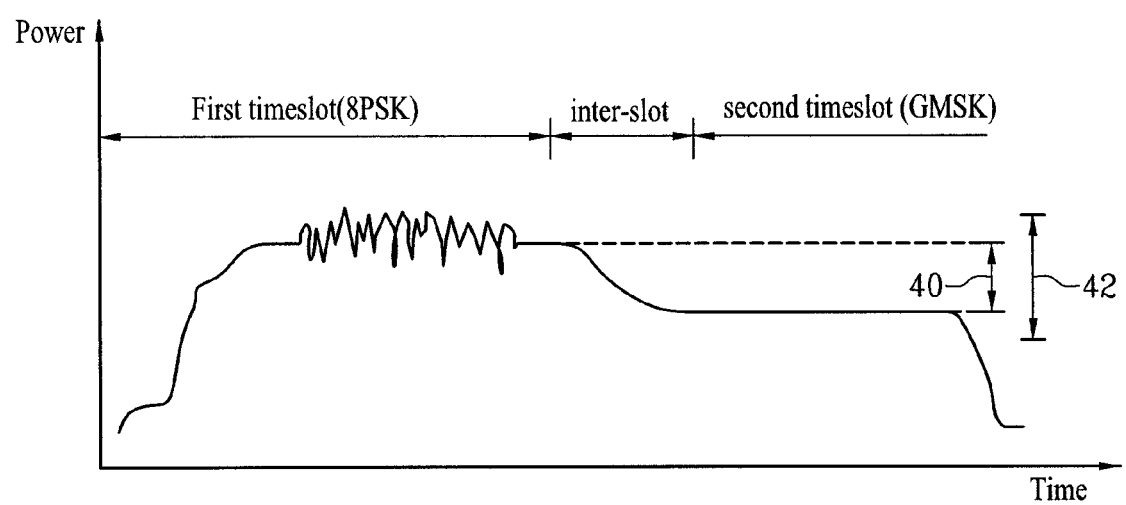
FIG. 4 is a graph illustrating a PVT value in accordance with an example embodiment of the present invention.

FIG. 3 discloses an example method for determining an inter-slot power level. FIG. 4 is discloses an example PVT graph of the inter-slot power level that can be achieved using the example method of FIG. 3. Referring to FIG. 3, individual power levels of first and second timeslots are acquired at S30. Signals modulated by the first and second timeslots are transmitted to a destination. The modulated signals transmitted via the first and second timeslots may be acquired by the same modulation scheme, or alternatively may instead be acquired by different modulation schemes. In the case of an EDGE system, data to be transmitted may be modulated, for example, by either a GMSK modulation scheme or an 8PSK modulation scheme.

Referring to FIG. 4, the signal transmitted via the first timeslot is modulated by an 8PSK modulation scheme, and the signal transmitted via the second timeslot is modulated by a GMSK modulation scheme. In the meantime, individual timeslot power-levels acquired at S30 may be equal to each other, or may alternatively be different from each other. The above-mentioned timeslot power-levels can be acquired by any power control operation known by those skilled in the art.

With reference again to FIG. 3, the power level of an inter-slot positioned between the first and second timeslots is determined at S32. The first timeslot power-level and the second timeslot power-level acquired at S30 are used to determine the inter-slot power level at S32.

As disclosed in FIG. 4, the first timeslot power-level and the second timeslot power-level define the limits of a predetermined power-level range 40. In the example the power-level range 40 disclosed in FIG. 4, the first timeslot power-level defines the maximum value of the range 40 and the second timeslot power-level defines the minimum value of the range 40. If the first timeslot power-level is exactly equal to the second timeslot power-level, the power-level range 40 includes only a single power-level that is equal to both the first and second timeslot power-levels.

The inter-slot power level is determined at S32. In one example embodiment, the inter-slot power level is maintained within a predetermined deviation from the power-level range 40 that is defined by the power levels of the first and second timeslots. In other words, as disclosed in FIG. 4, the inter-slot power level is maintained within an example deviation range 42 at S32.

The method for determining the inter-slot power level at S32 may be linearly determined in time, or may alternatively be nonlinearly determined in time, according to the first timeslot power-level and the second timeslot power-level acquired at S30. This linearization or non-linearization determination of the inter-slot power level can be implemented by an interpolation method. However, it should be noted that the inter-slot power level must be maintained within the predetermined deviation range 42 from the first and second timeslot power-levels acquired at S30. The inter-slot power level may instead be more narrowly maintained within the predetermined range 40, the limits of which are defined by the first and second timeslot power-levels.

The above-mentioned example method for non-linearly determining the inter-slot power level can be accomplished in various ways, and can be implemented by mathematical techniques well known to those skilled in the art. Examples of nonlinear interpolation methods include, but are not limited to, a polynomial interpolation method and a spline interpolation method.

In one example embodiment where the inter-slot power level is linearly determined, the inter-slot is divided into N sections. N is an integer such as the integer "16". The power level of each of the N sections is determined according to a slope defined by the first and second timeslot power-levels and the inter-slot time. One example method for linearly determining the inter-slot power level will be described with reference to FIG. 5 below.

After the inter-slot power level is determined at S32, data is transmitted to a destination at the determined inter-slot power level at S34. If the inter-slot power level determined at S32 is slightly changed from the first and second timeslot power-levels, spurious signals can be minimized, and undesirable modifications in the modulation characteristics can be avoided at S34.

Figure 5:
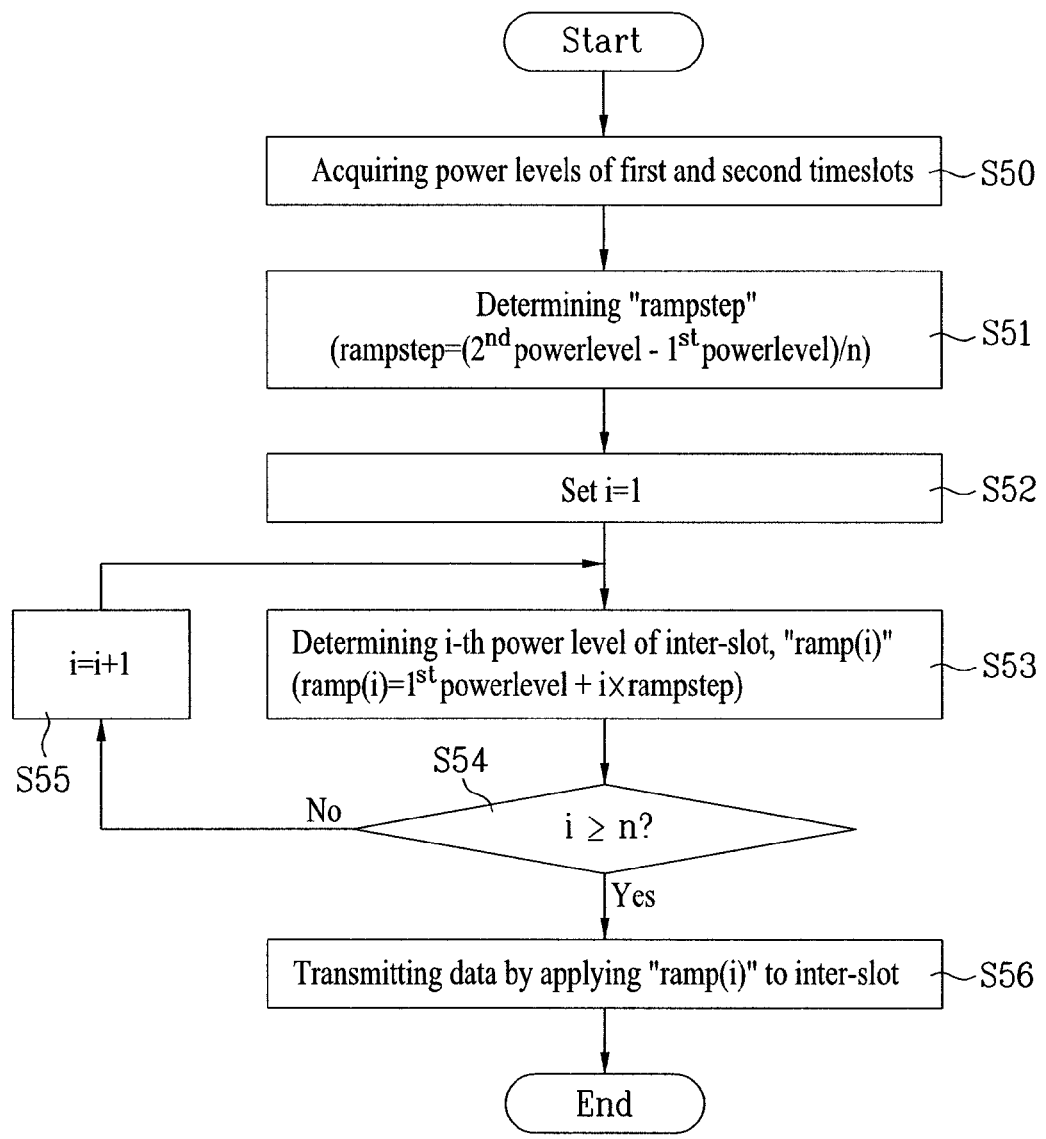
FIG. 5 is a flow chart illustrating a method for linearly determining an inter-slot power level according to an example embodiment of the present invention.

FIG. 5 discloses an example method for linearly determining an inter-slot power level according to one embodiment of the present invention. Referring to FIG. 5, power levels of first and second timeslots assigned to a transmitting device are acquired at S50. It should be noted that S50 of FIG. 5 is equivalent to the S30 of FIG. 3.

Thereafter, a specific value "rampstep" is determined using the first timeslot power-level and the second timeslot powerlevel at S51. The "rampstep" value is a power level which must be increased or decreased for each section of the inter-slot divided into N sections. In one example embodiment, the "rampstep" value can calculated using the following equation 1:

$$rampstep = \frac{2^{nd} powerlevel - 1^{st} powerlevel}{n} \quad \text{[Equation 1]}$$

With reference to Equation 1, $1^{st}$ powerlevel represents the first timeslot power-level and $2^{nd}$ powerlevel represents the second timeslot power-level. As previously stated above, the value of n is an integer that represents the number of division sections of the inter-slot. In this case, the inter-slot is divided into N sections according to time.

It should be noted that the inter-slot may be equally divided into a plurality of sections according to time, or may alternatively be variably divided into a plurality of sections according to time. In other words, individual sections of the inter-slot may have the same time gap, or may also have different time gaps. Different time-variant weights can be assigned to individual sections, respectively, such that the individual sections may have different gaps therebetween. If the sections have the same time gap, the same "rampstep" value is implemented for each section. However, if the sections have different gaps, the "rampstep" values of the individual sections may be different from each other.

Preferably, the value of N is set to a specific integer, such as the integer "16". However, it should be noted that the purposes of the example embodiments of the present invention can also be implemented even if integers other than the integer "16" are selected.

If the "rampstep" value is determined at S51, an index "i" of each section of the inter-slot divided into N sections is set to "1" at S52, and a power level "ramp(i)" of an i-th section is calculated using the following equation 2 at S53.

$$\text{ramp}(i) = 1^{st} \text{powerlevel} + i \times \text{rampstep}, i=1,2,\ldots n \quad \text{[Equation 2]}$$

With reference to Equation 2, all the "ramp(i)" values from 1 to N are determined at S53, S54, and S55.

After the inter-slot power level is determined at S51, S52, S53, S54, and S55, the determined inter-slot power level "ramp(i)" is applied to the inter-slot, such that the resultant data is transmitted to a destination at S56.

Figure 6:
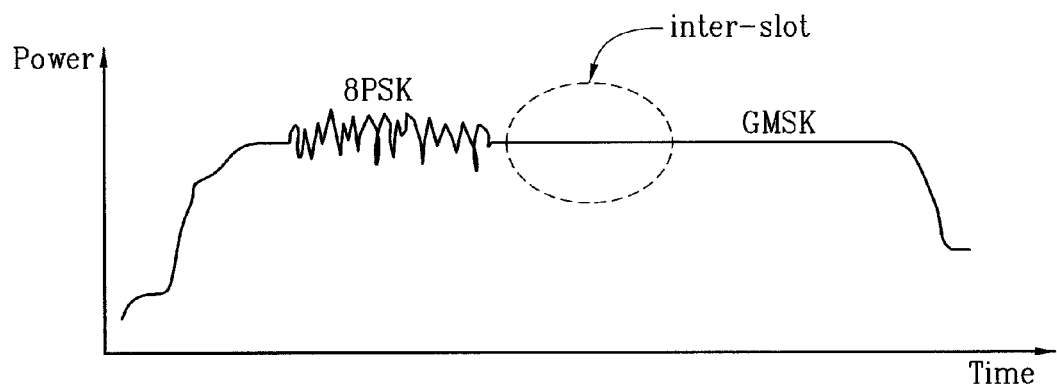
FIG. 6 is a waveform diagram illustrating an example case in which data modulated by different schemes is transmitted at the same power level according to an example embodiment of the present invention.
Figure 7:
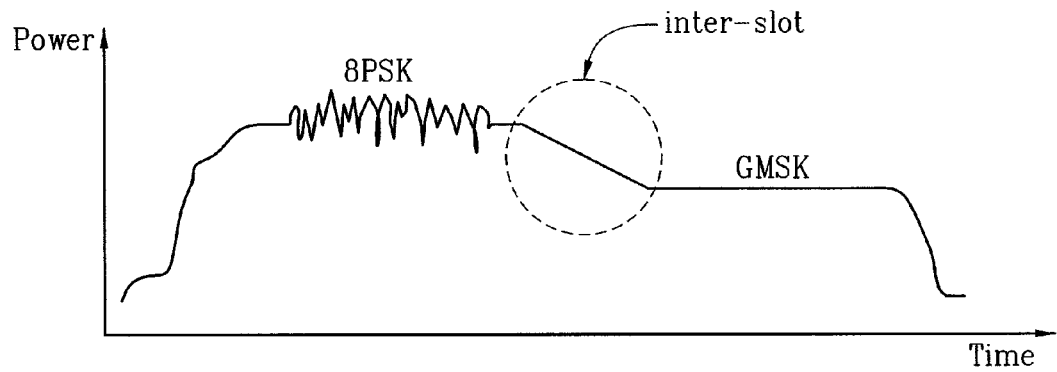
FIG. 7 is a waveform diagram illustrating an example case in which data modulated by different schemes is transmitted at different power levels according to an example embodiment of the present invention.

FIG. 6 discloses an example case in which data modulated by different schemes is transmitted at the same power level according to one example embodiment of the present invention. FIG. 7 is a waveform diagram illustrating another example case in which data modulated by different schemes is transmitted at different power levels according to one example embodiment of the present invention. As disclosed in FIGS. 6 and 7, the inter-slot power level is linearized, such that there is no abrupt variation in power level. The inter-slot power level of FIGS. 6 and 7 is linearized using the first timeslot power-level and the second timeslot power-level. As a result, although the first timeslot power-level is significantly different from the second timeslot power-level in FIG. 7, the linear characteristics of the inter-slot sections can be effectively maintained.

As apparent from the above description, the above-mentioned methods for determining the inter-slot power level according to example embodiments of the present invention have the following effects. First, the example methods for determining an inter-slot power level disclosed herein eliminate an abrupt power-level variation of an inter-slot positioned among a plurality of timeslots capable of transmitting data signals modulated by the same or different modulation methods, such that it can avoid modulation characteristics from being changed. Second, the example methods for determining an inter-slot power level disclosed herein can dynamically adjust an inter-slot power level according to the surrounding timeslot power-levels, such that the example methods can prevent spurious signals from being generated. Third, the example methods for determining an inter-slot power level disclosed herein can prevent the modification of modulation characteristics caused by an abrupt power-level variation between timeslots.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A method for determining an inter-slot power level, the method comprising:
    acquiring a first timeslot power level of a first timeslot and a second timeslot power level of a second timeslot, wherein the first and second timeslots are for transmitting modulated signals and an inter-slot is positioned between the first and second timeslots;
    determining an inter-slot power level using the acquired first and second timeslot power levels, such that the inter-slot power level is maintained within a predetermined deviation from a specific range defined by the acquired first and second timeslot power-levels,
    wherein the determining step comprises:
        dividing the inter-slot into N sections;
        dividing a difference between the second timeslot power-level and the first timeslot power-level by the value of N;
        acquiring a division resultant value;
        adding the division resultant value to the first timeslot power-level "i" times; and
        determining a power level of an i-th section from among the N sections of the inter-slot; and
    transmitting data using the determined inter-slot power level.

2. The method according to claim 1, wherein determining an inter-slot power level further comprises linearly determining the inter-slot power level according to time.

3. The method according to claim 1, wherein the power level of each section is determined by the following equations:

$$\text{ramp}(i) = 1^{st} powerlevel + i \times rampstep, i = 1, 2, \ldots n \quad \text{[Equations]}$$

$$rampstep = \frac{2^{nd} powerlevel - 1^{st} powerlevel}{n}$$

where ramp(i) represents a power level of an i-th section of the N sections, $1^{st}$ powerlevel represents the first timeslot power-level, $2^{nd}$ powerlevel and represents the second timeslot power-level.

4. The method according to claim 1, wherein determining an inter-slot power level further comprises non-linearly determining the inter-slot power level according to time.

5. The method according to claim 1, wherein the signals transmitted via the first timeslot and the second timeslot are modulated by different modulation schemes.

6. The method according to claim 1, wherein the first timeslot power level is equal to the second timeslot power level.

7. The method according to claim 1, wherein the first timeslot power level is different from the second timeslot power level.

8. The method according to claim 3, wherein N=16.

9. The method according to claim 5, wherein the signals transmitted via the first timeslot and the second timeslot are modulated by either a GMSK scheme or an 8PSK scheme.

10. A method for determining an inter-slot power level, the method comprising:
   acquiring a first timeslot power level of a first timeslot and a second timeslot power level of a second timeslot, wherein the first and second timeslots are for transmitting a modulated signals and an inter-slot is positioned between the first and second timeslots;
   determining an inter-slot power level using the acquired first and second timeslot power-levels,
      wherein the determining step comprises:
         dividing the inter-slot into N sections;
         dividing a difference between the second timeslot power-level and the first timeslot power-level by the value of N;
         acquiring a division resultant value;
         adding the division resultant value to the first timeslot power-level "i" times; and
         determining a power level of an i-th section from among the N sections of the inter-slot; and
   transmitting data using the determined inter-slot power level.

11. The method according to claim 10, wherein determining an inter-slot power level further comprises determining the inter-slot power level according to a linear interpolation scheme.

12. The method according to claim 10, wherein N=16.

13. The method according to claim 10, wherein determining the inter-slot power level further comprises determining the inter-slot power level according to a non-linear interpolation scheme.

14. The method according to claim 10, wherein the signals transmitted via the first timeslot and the second timeslot are modulated by one of a GMSK scheme or an 8PSK scheme.

15. A method for determining an inter-slot power level, the method comprising:
   acquiring first and second timeslot power levels of first and second timeslots, the first and second timeslots being configured for transmitting signals modulated by one of a GMSK scheme and an 8PSK scheme;
   determining an inter-slot power level of an inter-slot, the inter-slot being positioned between the first and second timeslots, such that the inter-slot power level is linearly changed in time according to a slope defined by the acquired first timeslot power level and the acquired second timeslot power-level,
      wherein the determining step comprises:
         dividing the inter-slot into N sections;
         dividing a difference between the second timeslot power-level and the first timeslot power-level by the value of N;
         acquiring a division resultant value;
         adding the division resultant value to the first timeslot power-level "i" times; and
         determining a power level of an i-th section from among the N sections of the inter-slot; and
   transmitting data using the determined inter-slot power level.

16. The method according to claim 15, wherein the first timeslot power level is different from the second timeslot power level.

17. The method according to claim 15, wherein the first and second timeslots are configured for transmitting signals modulated by different modulation schemes.

* * * * *